(12) United States Patent
Kaneto et al.

(10) Patent No.: US 12,353,127 B2
(45) Date of Patent: Jul. 8, 2025

(54) IMPRINT APPARATUS, IMPRINT METHOD AND ARTICLE MANUFACTURING METHOD

(71) Applicant: CANON KABUSHIKI KAISHA, Tokyo (JP)

(72) Inventors: Yusuke Kaneto, Tochigi (JP); Masato Shichijo, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 117 days.

(21) Appl. No.: 17/717,529

(22) Filed: Apr. 11, 2022

(65) Prior Publication Data

US 2022/0334471 A1    Oct. 20, 2022

(30) Foreign Application Priority Data

Apr. 14, 2021   (JP) .................................. 2021-068529
Dec. 2, 2021    (JP) .................................. 2021-196467

(51) Int. Cl.
*G03F 7/00*    (2006.01)

(52) U.S. Cl.
CPC .................................. *G03F 7/0002* (2013.01)

(58) Field of Classification Search
CPC ...................................................... G03F 7/0002
See application file for complete search history.

(56) References Cited

U.S. PATENT DOCUMENTS

| 2012/0080820 | A1* | 4/2012 | Narioka ................ G03F 7/0002 |
| | | | 264/293 |
| 2015/0042012 | A1 | 2/2015 | Nakagawa et al. |
| 2016/0327857 | A1 | 11/2016 | Kimura |
| 2018/0022015 | A1* | 1/2018 | Terao .................... B29C 59/002 |
| | | | 264/40.1 |
| 2019/0317398 | A1* | 10/2019 | Murakami ............. G03F 7/002 |

FOREIGN PATENT DOCUMENTS

| JP | 2012079969 A | 4/2012 |
| JP | 2016201522 A | 12/2016 |
| JP | 2019061977 A | 4/2019 |
| JP | 2019186477 A | 10/2019 |
| KR | 1020140116209 A | 10/2014 |
| KR | 1020160066499 A | 6/2016 |
| KR | 1020190073573 A | 6/2019 |

(Continued)

*Primary Examiner* — Larry W Thrower
*Assistant Examiner* — John W Hatch
(74) *Attorney, Agent, or Firm* — ROSSI, KIMMS & McDOWELL LLP

(57) ABSTRACT

The present invention provides an imprint apparatus for performing an imprint process of forming a pattern of an imprint material in a plurality of shot regions on a substrate using a mold, including a control unit configured to perform a first operation of, while driving the substrate such that a target shot region in the plurality of shot regions is located at a first position facing the mold, supplying a gas such that an amount of the gas between the mold and the target shot region becomes a reference amount, and a second operation of, after the first operation, if an error that it is estimated that the amount of the gas supplied between the mold and the target shot region does not reach the reference amount is generated, performing a process corresponding to the error.

13 Claims, 12 Drawing Sheets

(56) References Cited

FOREIGN PATENT DOCUMENTS

| KR | 1020190107572 A | 9/2019 |
| KR | 1020190120703 A | 10/2019 |
| KR | 1020190124643 A | 11/2019 |
| KR | 1020190136938 A | 12/2019 |
| KR | 1020210015657 A | 2/2021 |

\* cited by examiner

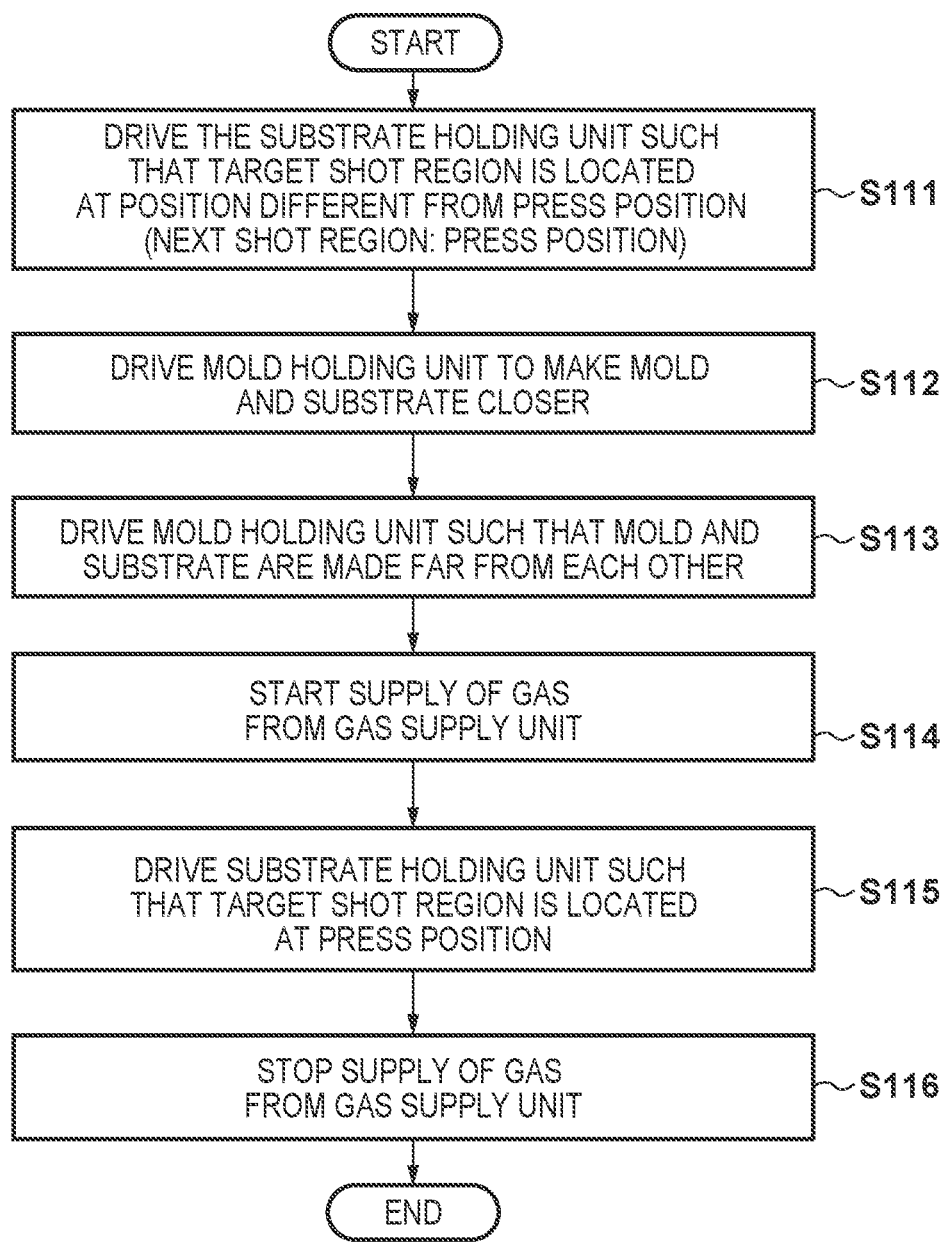

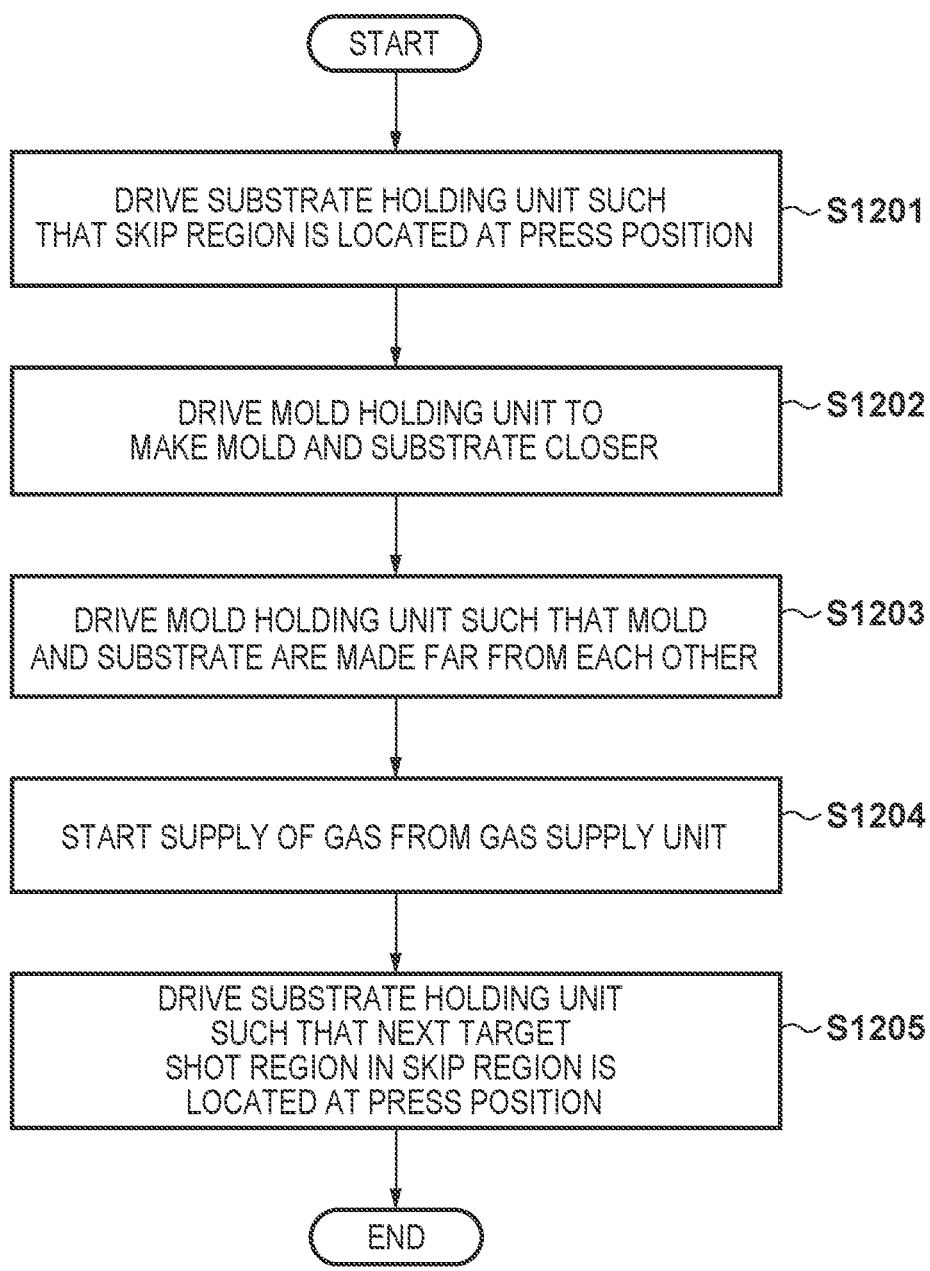

IMPRINT APPARATUS, IMPRINT METHOD AND ARTICLE MANUFACTURING METHOD

BACKGROUND OF THE INVENTION

Field of the Invention

The present invention relates to an imprint apparatus, an imprint method and an article manufacturing method.

Description of the Related Art

As the requirements of microfabrication for semiconductor devices, MEMS (Micro Electro Mechanical System), and the like grow, not only conventional photolithography techniques but also imprint techniques have received a great deal of attention. An imprint technique is a microfabrication technique for molding an imprint material on a substrate using a mold and forming a pattern of the imprint material on the substrate. According to the imprint technique, a fine structure on the order of several nanometers can be formed on the substrate.

In the imprint technique, a photo-curing method is used as one of imprint material curing methods. The photo-curing method is a method of curing an imprint material by irradiating it with light such as ultraviolet light in a state in which the imprint material supplied (arranged) on a substrate is in contact with a mold and separating the mold from the cured imprint material, thereby forming a pattern of the imprint material on the substrate.

In an imprint apparatus using the imprint technique, when filling the pattern (fine projections and grooves) of a mold with an imprint material, bubbles may remain (be confined) between the mold and the substrate, and an unfilled portion where imprint material filling is insufficient may be generated. In this case, because of the unfilled portion, a portion (unfilled defect) where the pattern is not formed is partially generated on the substrate.

Japanese Patent Laid-Open No. 2012-79969 proposes an imprint apparatus that suppresses residual bubbles by filling a space (gap) between a mold and a substrate with a gas having high solubility, high diffusibility, or both characteristics when bringing an imprint material on the substrate into contact with the mold. Japanese Patent Laid-Open No. 2012-79969 discloses a technique of supplying the gas having high solubility, high diffusibility, or both characteristics before a region (shot region) on the substrate where the imprint material is supplied passes through a gas supply position.

In the imprint apparatus, however, when continuously executing an imprint process for a plurality of shot regions on the substrate, continuous periodical driving may not be performed in the units of the apparatus due to a delay or error of the imprint process for the shot regions. In this case, it is difficult in the conventional technique to maintain the concentration of the gas to be supplied to the space between the mold and the substrate in a period from the end of the imprint process to the previous shot region to the start of the imprint process for the next shot region. Hence, the effect of suppressing an unfilled defect generated on the substrate cannot sufficiently be obtained, and it may be necessary to increase the time (filling time) to fill the pattern of the mold with the imprint material.

SUMMARY OF THE INVENTION

The present invention provides an imprint apparatus advantageous in terms of productivity or formation of a pattern of an imprint material.

According to one aspect of the present invention, there is provided an imprint apparatus for performing an imprint process of forming a pattern of an imprint material in a shot region on a substrate using a mold, including a supply unit configured to supply a gas between the mold and the substrate, and a control unit configured to control an operation of continuously performing the imprint process for a plurality of shot regions on the substrate to which an uncured imprint material is supplied while driving the substrate with respect to the mold, wherein the control unit performs, as the operation, a first operation of, while driving the substrate such that a target shot region in the plurality of shot regions, for which the imprint process should be performed, is located at a first position facing the mold, supplying the gas from the supply unit such that an amount of the gas between the mold and the target shot region becomes a reference amount, and a second operation of, after the first operation, if an error that it is estimated that the amount of the gas supplied between the mold and the target shot region by the first operation does not reach the reference amount is generated, performing a process corresponding to the error.

Further aspects of the present invention will become apparent from the following description of exemplary embodiments with reference to the attached drawings.

BRIEF DESCRIPTION OF THE DRAWINGS

FIG. 10 is a flowchart for describing the second gas supply operation.

FIG. 13 is a flowchart for describing the second gas supply operation.

DESCRIPTION OF THE EMBODIMENTS

Figure 1:
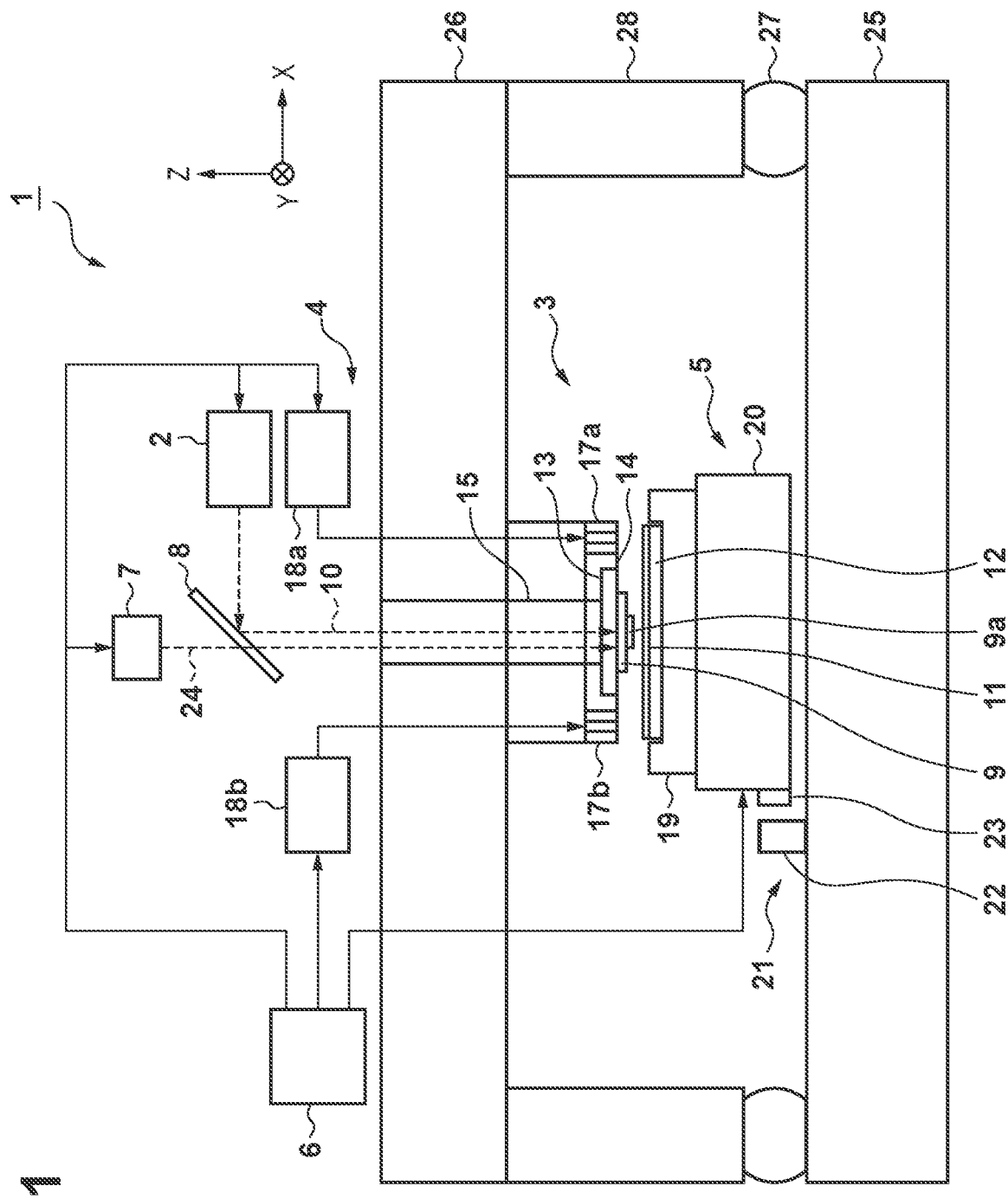
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

FIG. 1 is a schematic view illustrating configurations of an imprint apparatus 1 according to an aspect of the present invention. The imprint apparatus 1 is a lithography apparatus employed in a lithography step that is a manufacturing step for a device such as a semiconductor element, a liquid crystal display element, or magnetic storage medium as an article to form a pattern on a substrate. The imprint apparatus 1 brings an uncured imprint material supplied (arranged) on a substrate into contact with a mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

In this embodiment, the imprint apparatus 1 employs a photo-curing method as the curing method of the imprint material. As shown in FIG. 1, the imprint apparatus 1 includes a light irradiation unit 2, a mold holding unit 3, a gas supply unit 4, a substrate holding unit 5, a control unit 6, and an alignment measurement unit 7. Also, the imprint apparatus 1 includes a surface plate 25 on which the substrate holding unit 5 is placed and which forms a reference plane, a bridge surface plate 26 that fixes the mold holding unit 3, and a column 28 extended from the surface plate 25 to support the bridge surface plate 26 via an anti-vibration device 27 configured to remove vibrations from the floor surface. Furthermore, the imprint apparatus 1 includes a mold conveyance mechanism (not shown) that conveys a mold 9 between the mold holding unit 3 and the outside of the apparatus, and a substrate conveyance mechanism (not shown) that conveys a substrate 12 between the substrate holding unit 5 and the outside of the apparatus.

In an imprint process, the light irradiation unit 2 irradiates an imprint material 11 on the substrate with light 10 such as ultraviolet light via a dichroic mirror 8 and the mold 9. The light irradiation unit 2 includes, for example, a light source that emits the light 10, and an illumination optical system configured to adjust the light 10 emitted from the light source to a state appropriate for the imprint process. As the light source, a lamp such as a mercury lamp can be employed. However, it is not particularly limited, and any light source capable of emitting light having a wavelength to pass through the mold 9 and cure the imprint material 11 can be used. The illumination optical system includes, for example, a lens, a mirror, and an aperture or a shutter configured to switch irradiation and light shield. In this embodiment, since a photo-curing method is employed, the imprint apparatus 1 includes the light irradiation unit 2. If a thermosetting method is employed, the imprint apparatus 1 includes a heat source unit configured to set a thermosetting imprint material in place of the light irradiation unit 2.

The mold 9 has a polygonal, or preferably rectangular or square outer peripheral shape, and includes a pattern region 9a including a pattern formed into a three-dimensional shape (a projection and groove pattern such as a circuit pattern to be transferred onto the substrate 12) on a surface facing the substrate 12. Note that various sizes are employed as the size of the pattern of the mold 9 depending on an article as a manufacturing target, and a fine size on the order of several tens of nanometers is also included. The mold 9 is made of a material capable of passing the light 10 and having a small thermal expansion coefficient, for example, quartz. Note that the mold 9 may have a cavity having a circular planar shape and a depth to some extent on a surface (irradiation surface) to be irradiated with the light 10.

The mold holding unit 3 includes a mold chuck 13 that holds (sucks) the mold 9, a mold driving unit 14 that holds and drives the mold chuck 13, and a magnification correction mechanism (not shown) that corrects the shape of the mold 9 (pattern region 9a). The mold chuck 13 and the mold driving unit 14 include, at the center (inside) in the planar direction, an opening region 15 that allows the light 10 from the light irradiation unit 2 to pass to the imprint material 11 on the substrate. The magnification correction mechanism is provided around the mold 9 held by the mold chuck 13, and deforms the mold 9 (pattern region 9a) by mechanically applying an external force or displacement to the side surface of the mold 9.

The mold chuck 13 holds the mold 9 by attracting the outer peripheral region of the irradiation surface of the mold 9 by a vacuum suction force or an electrostatic force. If the mold 9 is held by, for example, a vacuum suction force, the mold chuck 13 is connected to a vacuum pump installed outside and appropriately adjusts the suction pressure by exhaust of the vacuum pump, thereby adjusting the suction force (holding force) to the mold 9.

The mold driving unit 14 drives the mold 9 (mold chuck 13) in the Z direction to selectively perform pressing the mold 9 against the imprint material 11 on the substrate (mold press) and releasing the mold 9 from the imprint material 11 on the substrate (mold release). A power source (actuator) applicable to the mold driving unit 14 is, for example, a linear motor or an air cylinder. To accurately position the mold 9, the mold driving unit 14 may be formed by a plurality of driving systems such as a coarse driving system and a fine driving system. In addition, the mold driving unit 14 may be configured to drive the mold 9 not only in the Z direction but also in the X direction or the Y direction. Furthermore, the mold driving unit 14 may be configured to have a tilt function for adjusting the position of the mold 9 in the θ (rotation about the Z-axis) direction or the tilt of the mold 9. The position of the mold 9 when driven by the mold driving unit 14 can be measured by a measurement unit including an optical displacement meter configured to measure the distance between the mold 9 and the substrate 12.

In an operation of pressing the mold 9, the gas supply unit 4 supplies a gas 16 to the space (gap) between the mold 9 and the substrate 12. This aims at shortening the time to fill the pattern region 9a of the mold 9 with the imprint material 11 or improving the filling property by suppressing remaining of bubbles in the portion filled with the imprint material 11. Also, the gas supply unit 4 supplies the gas 16 to the space between the mold 9 and the substrate 12 in an operation of releasing the mold 9 as well. This aims at improving the mold release property by reducing the force (releasing force) needed to release the mold 9 from the cured imprint material 11 on the substrate. From the viewpoint of the above-described filling property or mold release property, the gas 16 is preferably a gas having excellent solubility or diffusibility for the imprint material 11, and includes, for example, helium, carbon dioxide, nitrogen, hydrogen, xenon, condensable gas, and the like.

Figure 2:
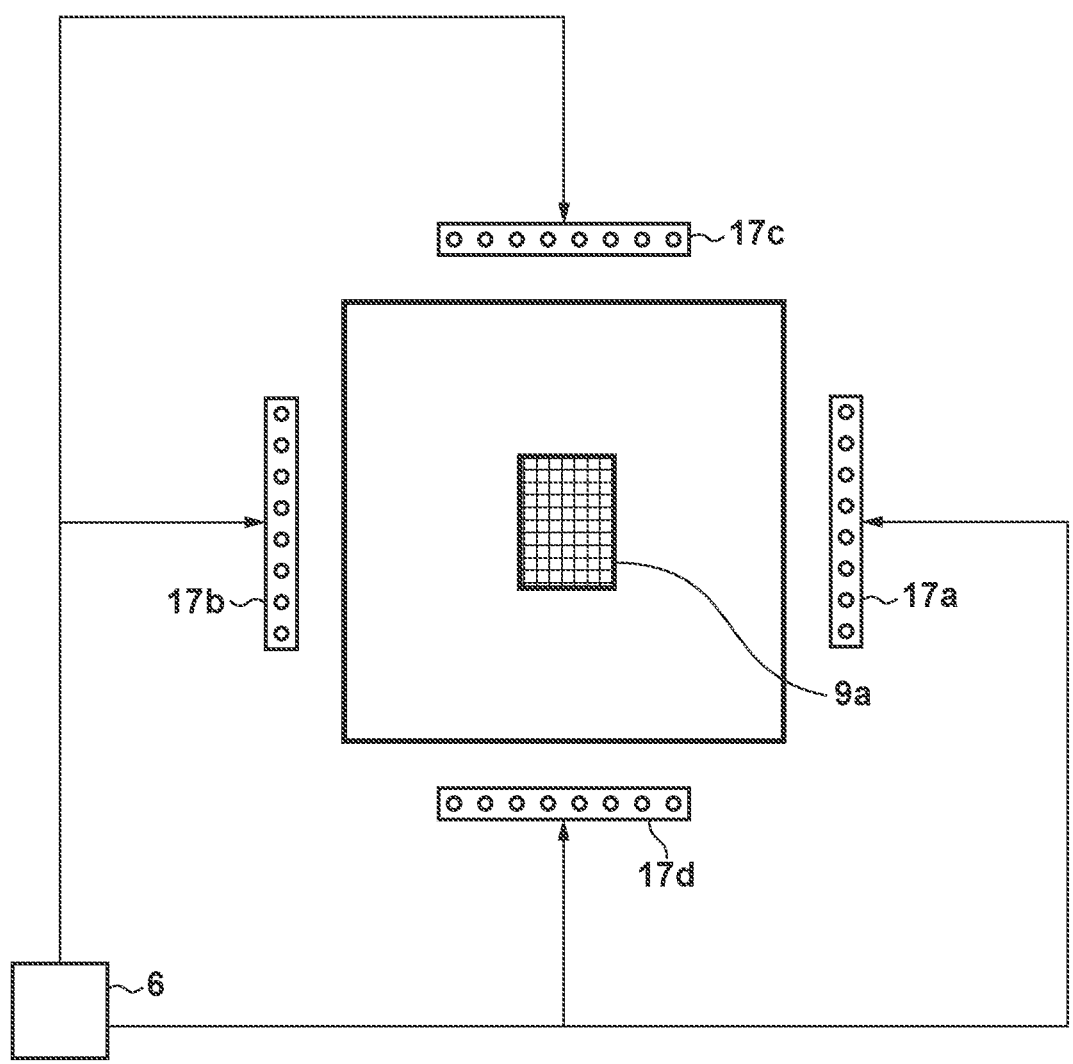
FIG. 2 is a view illustrating the configuration of a gas supply unit.

FIG. 2 is a view illustrating the configuration of the gas supply unit 4 from the lower side (the side of the substrate holding unit 5). As shown in FIG. 2, the gas supply unit 4 includes a plurality of supply ports 17a, 17b, 17c, and 17d. The plurality of supply ports 17a to 17d are arranged near the four side surfaces of the mold 9 to surround the mold 9 and supply the gas 16 to the side of the substrate holding unit 5. The control unit 6 has a function of controlling the supply amount, the concentration, and the like of the gas 16 supplied from each supply port in correspondence with each of the plurality of supply ports 17a to 17d.

The substrate 12 includes regions to which the pattern of the mold 9 is transferred, that is, a plurality of shot regions that are pattern formation regions. The shot region is a partition region as the unit of a region where the imprint process on the substrate should be performed. In each shot region of the substrate 12, (a layer including) a pattern of the imprint material 11 is formed.

The substrate holding unit 5 is a holding mechanism that holds the substrate 12. The substrate holding unit 5 includes, for example, a substrate chuck 19 that sucks the substrate 12, and a substrate driving unit 20 that mechanically holds the substrate chuck 19 and drives it in each axial direction. Also, an encoder system 21 is arranged in correspondence with each of the X direction, the Y direction, and the Z direction to measure the position of the substrate holding unit 5. The encoder system 21 can measure the position of the substrate holding unit 5 in real time by irradiating an encoder scale 23 with light from an encoder head 22.

The substrate chuck 19 supports the back surface of the substrate 12 by, for example, a plurality of pins having the same height, and sucks (holds) the substrate 12 by vacuum-exhausting portions other than the pins and reducing the pressure. As a power source applicable to the substrate driving unit 20, a driving source that vibrates little during a driving or standstill state is preferable, and, for example, a linear motor or a plane motor is used. The substrate driving unit 20 may be formed by a plurality of driving systems such as a coarse driving system and a fine driving system in each of the X direction and the Y direction. In addition, the substrate driving unit 20 may be configured to drive the substrate 12 (substrate chuck 19) not only in the X direction and the Y direction but also in the Z direction. Furthermore, the substrate driving unit 20 may be configured to have a tilt function for adjusting the position of the substrate 12 in the θ (rotation about the Z-axis) direction or the tilt of the substrate 12.

In this embodiment, the operations of pressing and releasing the mold 9 are implemented by driving the mold 9 in the Z direction, as described above. However, the operations of pressing and releasing the mold 9 may be implemented by driving the substrate 12 in the Z direction or by driving both the mold 9 and the substrate 12 relatively in the Z direction.

The alignment measurement unit 7 irradiates the mold 9 and the substrate 12 with alignment light 24 and detects light from alignment marks provided on the mold 9 and the substrate 12, thereby measuring the relative position (positional deviation) between the mold 9 and the substrate 12.

The control unit 6 is formed by a computer including a CPU and a memory, and controls the units of the imprint apparatus 1 in accordance with a program stored in the memory. The control unit 6 controls the operations and adjustment of the units of the imprint apparatus 1, thereby controlling the imprint process of forming the pattern of the imprint material 11 on the substrate using the mold 9. The control unit 6 may be formed integrally with the remaining portions of the imprint apparatus 1 (in a common housing), or may be formed separately from the remaining portions of the imprint apparatus 1 (in another housing).

The operation of the imprint apparatus 1 will be described. First, the control unit 6 loads the substrate 12 into the imprint apparatus 1 via the substrate conveyance mechanism and causes the substrate holding unit 5 (substrate chuck 19) to hold the substrate 12. The imprint material 11 is supplied in advance to the substrate 12 loaded into the imprint apparatus 1. Next, while driving the substrate holding unit 5 (substrate driving unit 20) to appropriately change the position of the substrate 12, the control unit 6 causes the alignment measurement unit 7 to sequentially detect alignment marks provided on the substrate 12, thereby measuring the position of the substrate 12 held by the substrate holding unit 5. The control unit 6 then calculates the position coordinates (transfer coordinates) of each of the plurality of shot regions of the substrate 12 based on the measurement result of the alignment measurement unit 7, and sequentially forms the pattern in each shot region in accordance with the calculation result.

A process of forming a pattern in one shot region, that is, a so-called imprint process will be described here. First, the control unit 6 drives the substrate holding unit 5 (substrate driving unit 20) such that a shot region of the substrate 12 is located at a press position under the pattern region 9a of the mold 9, thereby positioning the substrate 12. Next, while executing positioning (alignment) between the pattern region 9a of the mold 9 and the shot region of the substrate 12, the control unit 6 drives the mold holding unit 3 (mold driving unit 14) to bring the mold 9 into contact with the imprint material 11 on the substrate and press the mold against it (pressing step). Accordingly, the imprint material 11 on the substrate fills the pattern region 9a of the mold 9. Note that the control unit 6 determines completion of press of the mold 9 against the imprint material 11 on the substrate using a load sensor (not shown) provided in the mold holding unit 3. Next, in a state in which the imprint material 11 on the substrate is in contact with the mold 9, the control unit 6 irradiates the imprint material 11 with light from the light irradiation unit 2 for a predetermined time, thereby curing the imprint material 11 (curing step). Then, the control unit 6 drives the mold holding unit 3 (mold driving unit 14) to release the mold 9 from the cured imprint material 11 on the substrate (release step). Accordingly, a three-dimensional pattern (layer) of the imprint material 11 in conformity with the pattern of the pattern region 9a of the mold 9 is formed in the shot region of the substrate 12. By sequentially executing the series of steps for the shot regions of the substrate 12, the pattern of the imprint material 11 can be formed in each of the plurality of shot regions of the substrate 12.

Note that in this embodiment, the imprint material 11 is supplied in advance to the substrate 12 loaded into the imprint apparatus 1, as described above. However, the present invention is not limited to this. As one step of the imprint process, a supply step of supplying the imprint material 11 to the substrate 12 after the substrate 12 is loaded into the imprint apparatus 1 may be provided.

In this imprint process, in the pressing step of bringing the mold 9 into contact with the imprint material 11 on the substrate and pressing the mold against it, it is necessary to evenly (sufficiently) fill the pattern region 9a of the mold 9 with the imprint material 11. At this time, bubbles may remain in the imprint material 11 that fills the pattern region 9a of the mold 9. If curing of the imprint material 11 is executed in this state, an unfilled defect may be generated in the pattern of the imprint material 11 formed on the substrate. Such an unfilled defect affects an article such as a semiconductor device to be manufactured.

Hence, when executing the pressing step (at least at the start of the pressing step), the gas 16 is supplied from the gas supply unit 4 to the space between the mold 9 and the substrate 12, as described above. When the gas 16 is supplied to the space between the mold 9 and the substrate 12, and a predetermined time elapses, the concentration of the gas 16 near the pattern region 9a of the mold 9 becomes sufficiently high (for example, 70% or more) because of the diffusion effect of the gas 16. It is therefore possible to efficiently suppress residual of the bubbles. However, until the concentration of the gas 16 in the space between the mold 9 and the substrate 12 becomes sufficiently high, predetermined time, that is, a wait time is necessary, as described above. Such a wait time changes depending on the configuration around the mold 9 or the needed concentration of the gas 16 and is one sec to several tens of seconds or more in a general imprint apparatus. The wait time is preferably as short as possible because it affects the productivity (throughput) of the imprint apparatus 1.

In this embodiment, there is provided a technique for enabling a quick increase of the concentration of the gas 16 in the space between the mold 9 and the substrate 12 (the amount of the gas 16 supplied to the space between the mold 9 and the substrate 12). Hence, the imprint apparatus 1 can implement high productivity while suppressing unfilled defects generated in the pattern of the imprint material 11 formed on the substrate.

In this embodiment, it is assumed that the imprint process is continuously performed for the plurality of shot regions on the substrate to which the uncured imprint material 11 is supplied. A first gas supply operation (first operation) that is a basic operation of supplying the gas 16 from the gas supply unit 4 in a case in which the imprint process is continuously performed for the plurality of shot regions on the substrate will be described.

Figure 3A:
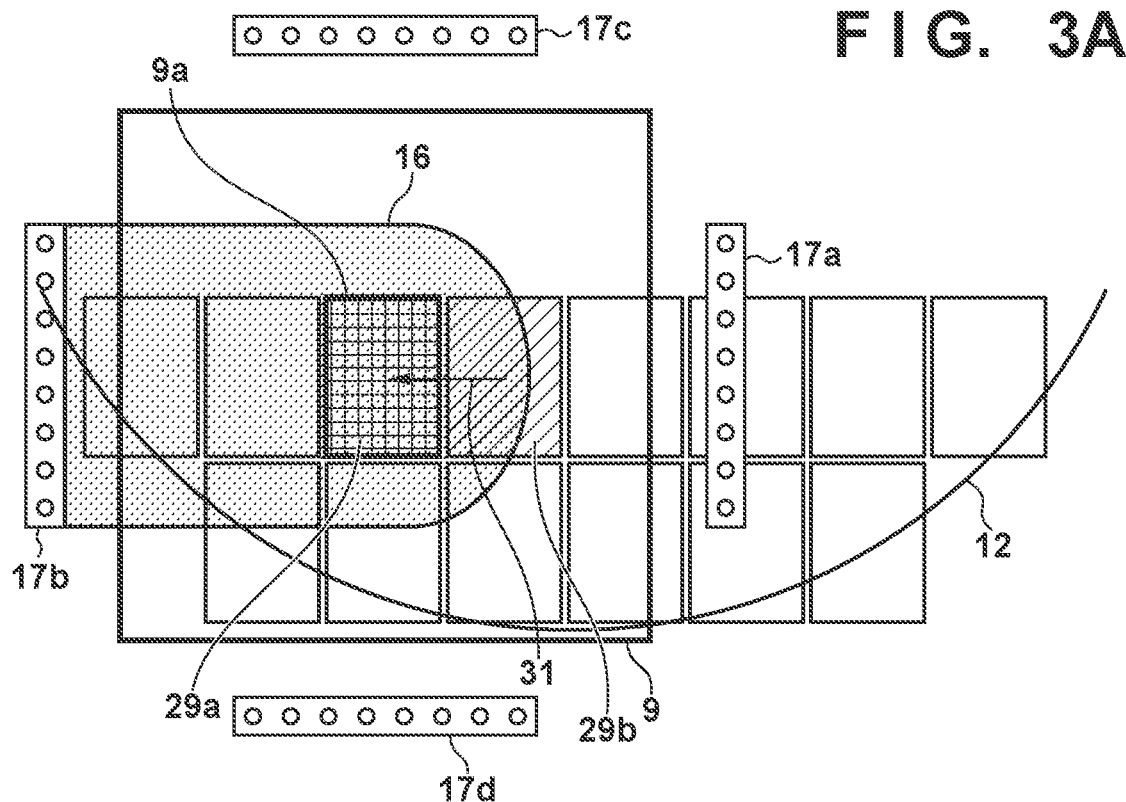
FIGS. 3A and 3B are views for describing a first gas supply operation in time series.
Figure 3B:
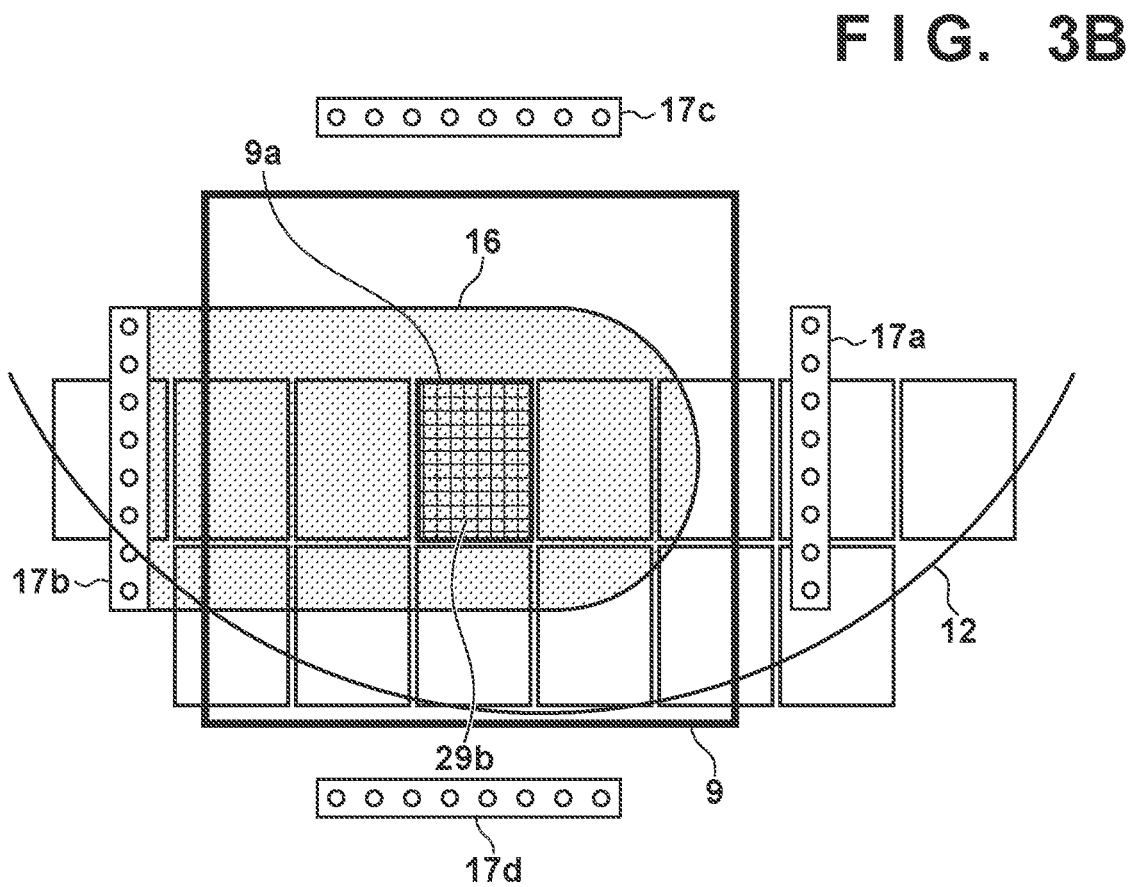

The first gas supply operation will be described in time series with reference to FIGS. 3A and 3B. FIGS. 3A and 3B are views illustrating the gas supply operation of the gas supply unit 4 and the driving operation of the substrate holding unit 5 when each shot region on the substrate is being located under the mold 9, that is, at the press position (first position) facing the pattern region 9a of the mold 9. FIGS. 3A and 3B show the gas supply unit 4, the mold 9, and the substrate 12 from above (the side of the mold holding unit 3).

Referring to FIG. 3A, a shot region for which the imprint process is to be performed is defined as a target shot region 29b, and a shot region for which the imprint process has been performed before the target shot region 29b is defined as a previous shot region 29a. FIG. 3A shows a state immediately after the imprint process is performed for the previous shot region 29a. The control unit 6 drives the substrate holding unit 5 in a driving direction 31 from the state shown in FIG. 3A such that the target shot region 29b is located at the press position facing the pattern region 9a of the mold 9. Also, while driving the substrate holding unit 5, the control unit 6 supplies the gas 16 from the supply port 17b of the gas supply unit 4 located in the driving direction 31 of the substrate holding unit 5 using the pattern region 9a of the mold 9 as a reference. At this time, the gas 16 already supplied (filled) in the space between the mold 9 and the substrate 12 (substrate holding unit 5) and the gas 16 supplied from the supply port 17b are drawn to the downstream in the driving direction 31 in accordance with the driving of the substrate holding unit 5. Hence, the gas 16 already supplied in the space between the mold 9 and the substrate 12 and the gas 16 supplied from the supply port 17b are supplied to the space between the pattern region 9a of the mold 9 and the target shot region 29b. Hence, as shown in FIG. 3B, the amount of the gas 16 supplied to the space between the pattern region 9a of the mold 9 and the target shot region 29b reaches a reference amount, and the concentration of the gas 16 in the space can be set to a sufficiently high concentration and maintained.

Figure 4:
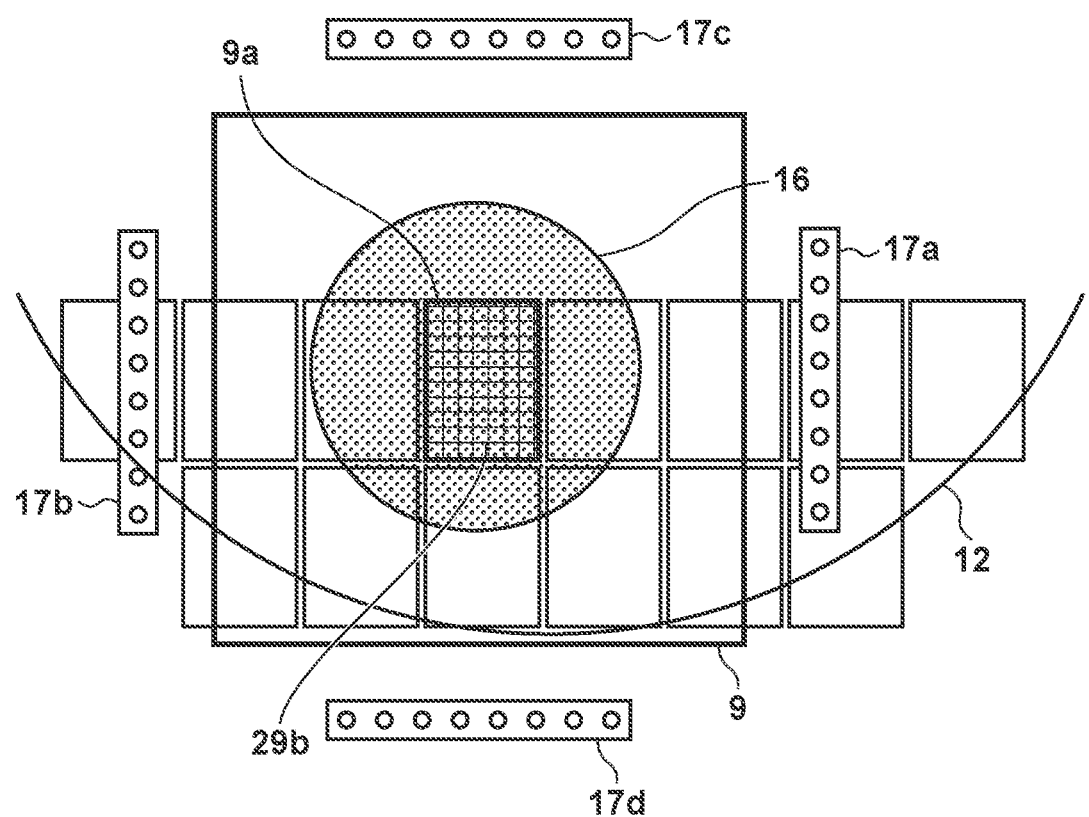
FIG. 4 is a view illustrating a state in which the concentration of a gas in the space between a mold and a target shot region lowers.

However, if an error such as a delay or stop of the imprint process for the shot region 29a before the target shot region 29b is generated, the concentration of the gas 16 in the space between the pattern region 9a of the mold 9 and the target shot region 29b lowers, as shown in FIG. 4. FIG. 4 is a view illustrating a state in which the concentration of the gas 16 in the space between the pattern region 9a of the mold 9 and the target shot region 29b lowers immediately before the imprint process is performed for the target shot region 29b. In this case, since the amount of the gas 16 supplied to the space between the pattern region 9a of the mold 9 and the target shot region 29b does not reach the reference amount, it is difficult to set the concentration of the gas 16 in this space to a sufficiently high concentration and maintain it.

In this embodiment, before the imprint process for the target shot region 29b is started, it is determined whether periodical continuous driving has been performed in the imprint process for the previous shot region 29a. If periodical continuous driving is performed in the imprint process for the previous shot region 29a, the imprint process for the previous shot region 29a is normally performed. Hence, in the imprint process for the target shot region 29b, the amount of the gas 16 supplied to the space between the pattern region 9a of the mold 9 and the target shot region 29b by the first gas supply operation reaches the reference amount, as described with reference to FIGS. 3A and 3B. On the other hand, if periodical continuous driving is not performed in the imprint process for the previous shot region 29a, an error such as a delay or stop of the imprint process is generated in the imprint process for the previous shot region 29a. Hence, in the imprint process for the target shot region 29b, the amount of the gas 16 supplied to the space between the pattern region 9a of the mold 9 and the target shot region 29b by the first gas supply operation does not reach the reference amount, as described with reference to FIG. 4. Hence, the control unit 6 detects generation of an error that it is estimated that the amount of the gas 16 supplied to the space between the pattern region 9a of the mold 9 and the target shot region 29b by the first gas supply operation does not reach the reference amount. For example, the control unit 6 detects generation of the error based on the timing of starting supply of the gas 16 from the gas supply unit 4 in the first gas supply operation, more specifically, if the timing delays from a reference. Also, the control unit 6 detects generation of the error based on the time needed to release the mold 9 from the cured imprint material 11 on the previous shot region in the imprint process performed for the previous shot region 29a, more specifically, if the time is longer than a reference. If the generation of the error is detected, a process corresponding to the error, more specifically, a second gas supply operation to be described below is performed in addition to the first gas supply operation. Accordingly, the amount of the gas 16 supplied to the space between the pattern region 9a of the mold 9 and the target shot region 29b reaches the reference amount, and the concentration of the gas 16 in the space can be set to a sufficiently high concentration and maintained.

The operation of the imprint apparatus 1 according to this embodiment, particularly, an overall procedure including the first gas supply operation and the second gas supply operation will be described with reference to FIG. 5. A gas supply operation after the imprint process for the previous shot region 29a is performed until the imprint process for the target shot region 29b is performed will be described here.

In step S101, in a state in which the pattern region 9a of the mold 9 and the previous shot region 29a face each other (a state in which the release step is ended), the control unit 6 starts supply of the gas 16 from the gas supply unit 4. More specifically, the control unit 6 selects at least the supply port 17b located in the driving direction 31 of the substrate holding unit 5 from the supply ports 17a to 17d of the gas supply unit 4, and supplies the gas 16 from the supply port 17b. At this time, the gas 16 is supplied from the gas supply unit 4 (supply port 17b) such that the amount of the gas 16 in the space between the pattern region 9a of the mold 9 and the target shot region 29b reaches the reference amount.

In step S102, the control unit 6 drives the substrate holding unit 5 (substrate 12) in the driving direction 31 such that the target shot region 29b is located at the press position facing the pattern region 9a of the mold 9. Accordingly, the gas 16 is drawn to the downstream in the driving direction 31 of the substrate holding unit 5 and supplied to the space between the pattern region 9a of the mold 9 and the target shot region 29b.

In step S103, when the target shot region 29b is located at the press position (when the driving of the substrate holding unit 5 is stopped), the control unit 6 stops supply of the gas 16 from the gas supply unit 4.

In this embodiment, the operation from step S101 to step S103 is the first gas supply operation that is the basic operation of supplying the gas 16 from the gas supply unit 4. The first gas supply operation is an operation of supplying the gas 16 from the gas supply unit 4 such that the amount of the gas 16 between the mold 9 and the target shot region 29b reaches the reference amount while driving the substrate 12 such that the target shot region 29b is located at the press position facing the mold 9.

In step S104, the control unit 6 determines whether generation of an error that it is estimated that the amount of the gas 16 supplied to the space between the pattern region 9a of the mold 9 and the target shot region 29b by steps S101 to S103 (first gas supply operation) does not reach the reference amount is detected. The detection of generation of the error is the same as described above, and a detailed description thereof will be omitted here. If generation of the error is not detected, the process advances to step S106. On the other hand, if generation of the error is detected, the process advances to step S105.

In step S105, the control unit 6 performs the second gas supply operation of supplying the gas 16 from the gas supply unit 4 such that the gas 16 is supplied between the mold 9 and the target shot region 29b. The second gas supply operation is an operation of resuming supply of the gas 16 from the gas supply unit 4. Note that details of the second gas supply operation will be described later with reference to FIGS. 6A, 6B, and 7.

In step S106, the control unit 6 forms the pattern of the imprint material 11 on the target shot region 29b using the mold 9. More specifically, the pressing step, the curing step, and the release step in the steps of the above-described imprint process are performed.

Figure 6A:
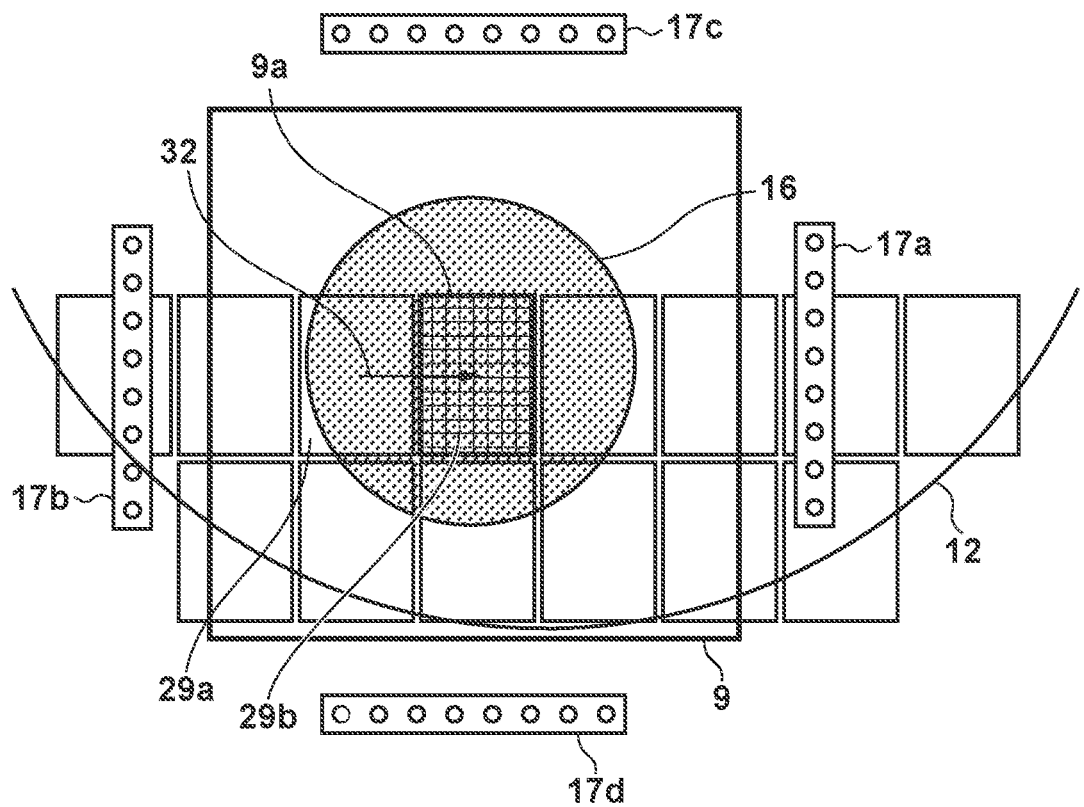
FIGS. 6A and 6B are views for describing a second gas supply operation.
Figure 6B:
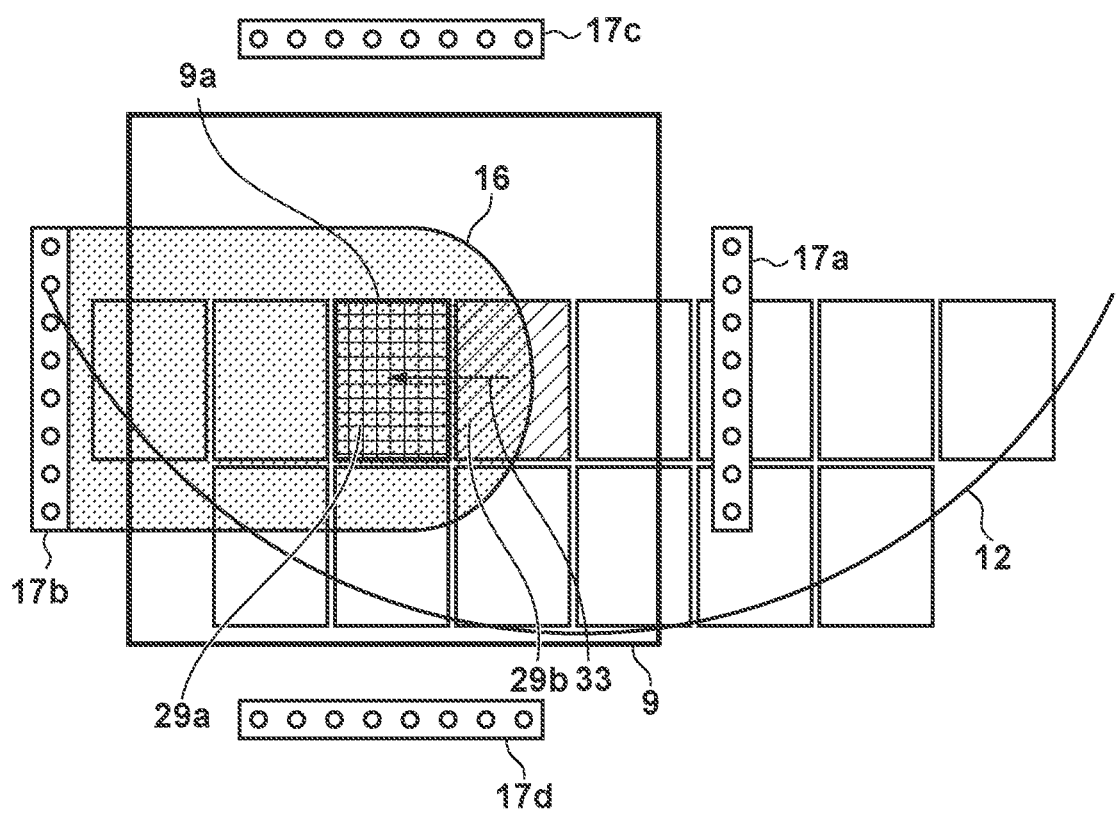
Figure 7:
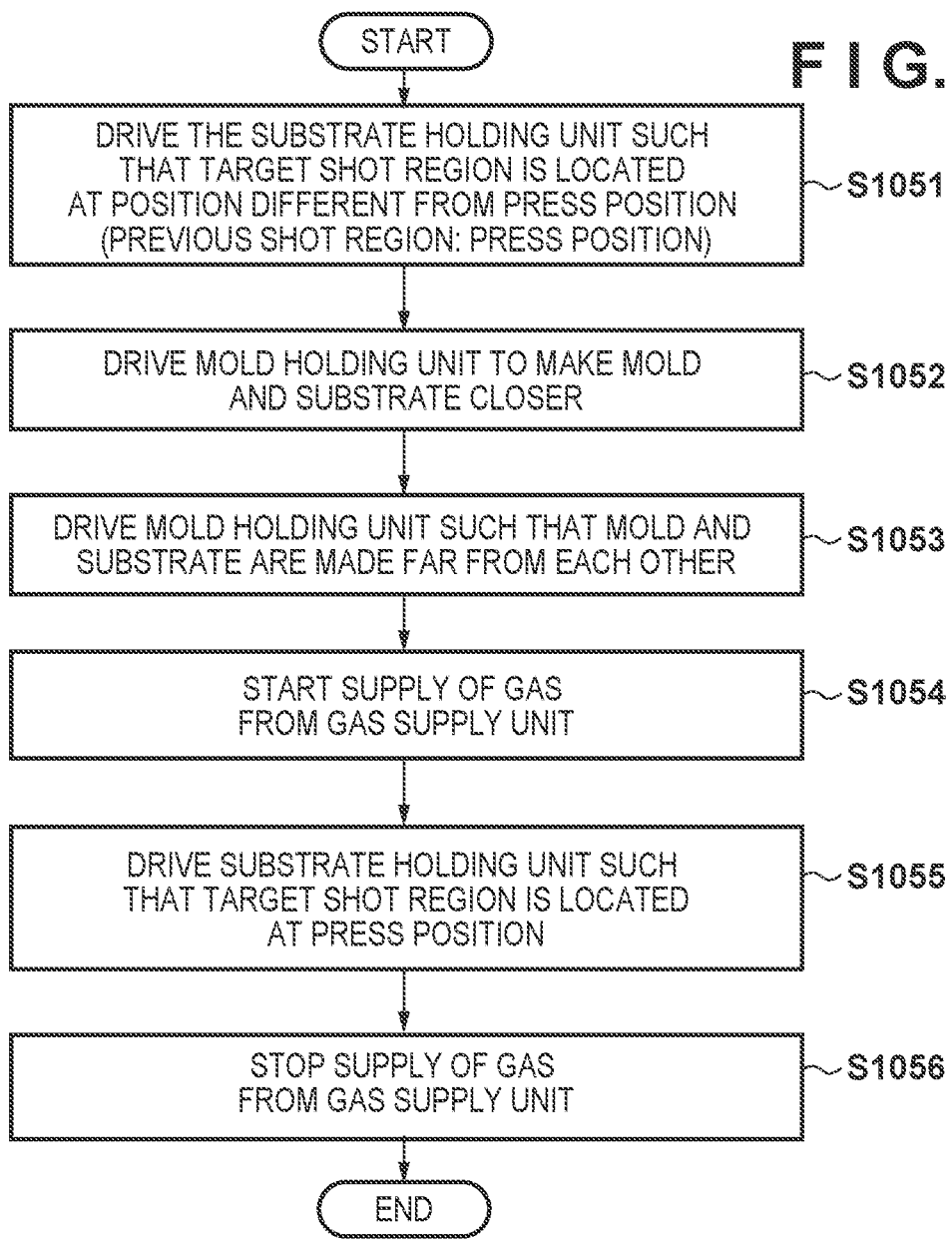
FIG. 7 is a flowchart for describing the second gas supply operation.

The second gas supply operation will be described with reference to FIGS. 6A, 6B, and 7. FIGS. 6A and 6B are views illustrating the gas supply operation of the gas supply unit 4 and the driving operation of the substrate holding unit 5 in the second gas supply operation. FIGS. 6A and 6B show the gas supply unit 4, the mold 9, and the substrate 12 from above (the side of the mold holding unit 3). FIG. 7 is a flowchart for describing the second gas supply operation.

In step S1051, the control unit 6 drives the substrate holding unit 5 (substrate 12) in a driving direction 32 such that the target shot region 29b is located at a position (second position) different from the press position, as shown in FIG. 6A. In this embodiment, the substrate holding unit 5 is driven such that the previous shot region 29a is located at the press position under the pattern region 9a of the mold 9. Hence, in this embodiment, the position different from the press position is a position where the target shot region 29b is located in the state in which the previous shot region 29a is located at the press position.

In step S1052, the control unit 6 drives the mold holding unit 3 (mold 9) in the Z direction (downward) to make the mold 9 and the substrate 12 closer to such an extent that these do not come into contact with each other. For example, the mold holding unit 3 is driven such that the mold 9 is located at a position immediately before it comes into contact with the substrate 12. In other words, in step S1052, a pseudo pressing step is performed.

In step S1053, the control unit 6 drives the mold holding unit 3 (mold 9) in the Z direction (upward) such that the mold 9 and the substrate 12 which are made closer to such an extent that these do not come into contact with each other are made far from each other. For example, the mold holding unit 3 is driven such that the mold 9 is located at the position before step S1052 is performed (such that the mold 9 returns to the original position). In other words, in step S1053, a pseudo release step is performed.

When the pseudo pressing step (S1052) and the pseudo release step (S1053) are performed, for example, the gas 16 supplied by the first gas supply operation and already existing around the mold 9 can be drawn to the lower side of the mold 9.

In step S1054, the control unit 6 starts (resumes) supply of the gas 16 from the gas supply unit 4 in a state in which the target shot region 29b is located at the position different from the press position. More specifically, the control unit 6 selects at least the supply port 17b located in a driving direction 33 of the substrate holding unit 5 from the supply ports 17a to 17d of the gas supply unit 4, and supplies the gas 16 from the supply port 17b, as shown in FIG. 6B.

In step S1055, the control unit 6 drives the substrate holding unit 5 (substrate 12) in the driving direction 33 such that the target shot region 29b is located at the press position facing the pattern region 9a of the mold 9. Accordingly, the gas 16 is drawn to the downstream in the driving direction 33 of the substrate holding unit 5 and supplied to the space between the pattern region 9a of the mold 9 and the target shot region 29b.

In step S1056, when the target shot region 29b is located at the press position (when the driving of the substrate holding unit 5 is stopped), the control unit 6 stops supply of the gas 16 from the gas supply unit 4.

In this embodiment, if the error that it is estimated that the amount of the gas 16 supplied to the space between the pattern region 9a of the mold 9 and the target shot region 29b by the first gas supply operation does not reach the reference amount is generated, the first gas supply operation and the second gas supply operation are performed. Accordingly, the amount of the gas 16 supplied to the space between the pattern region 9a of the mold 9 and the target shot region 29b reaches the reference amount, and the concentration of the gas 16 in the space can be set to a sufficiently high concentration and maintained. Hence, the imprint apparatus 1 can implement high productivity while suppressing unfilled defects generated in the pattern of the imprint material 11 formed on the substrate.

Figure 5:
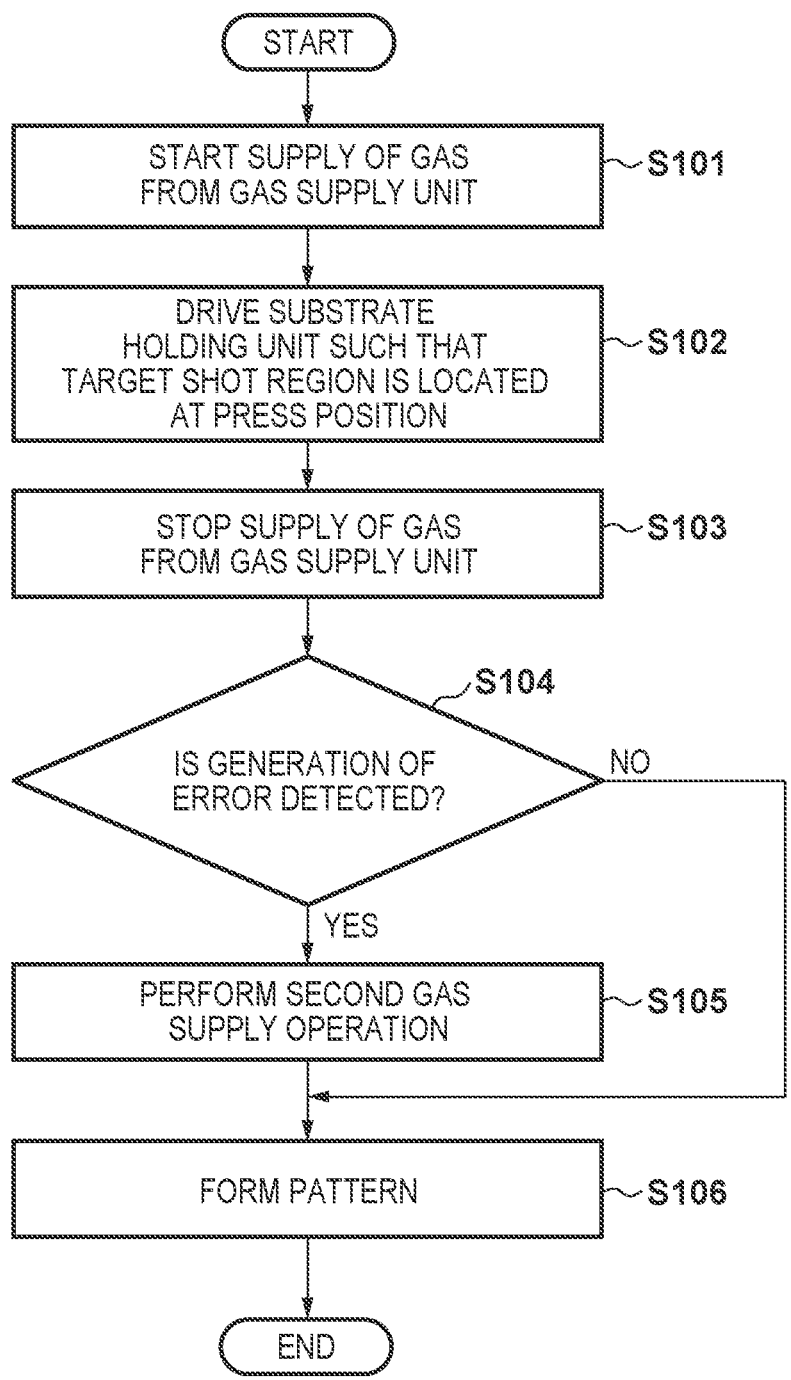
FIG. 5 is a flowchart for describing the operation of the imprint apparatus shown in FIG. 1.

Note that if the error that it is estimated that the amount of the gas 16 supplied to the space between the pattern region 9a of the mold 9 and the target shot region 29b by the first gas supply operation does not reach the reference amount is not generated, the second gas supply operation is not performed, and only the first gas supply operation is performed (FIG. 5).

Also, the position (second position) different from the press position, at which the target shot region 29b is located in step S1051, may be changed in accordance with the delay time of the timing of starting supply of the gas 16 from the gas supply unit 4 in the first gas supply operation. The shortage amount of the gas 16 between the mold 9 and the target shot region 29b from the reference amount changes depending on the delay time of the timing of starting supply of the gas 16 from the gas supply unit 4 in the first gas supply operation. For example, the longer the delay time is, the larger the amount of the gas 16 leaking from between the mold 9 and the target shot region 29b is. Hence, the shortage amount increases. Hence, the longer the delay time of the timing of starting supply of the gas 16 from the gas supply unit 4 in the first gas supply operation is, the more the position at which the target shot region 29b is located in step S1051 is preferably separated from the press position. At the same time, the position different from the press position, at which the target shot region 29b is located, may be changed in accordance with the time needed to release the mold 9 from the cured imprint material 11 on the previous shot region in the imprint process performed for the previous shot region 29a. The shortage amount of the gas 16 between the mold 9 and the target shot region 29b from the reference amount changes depending on the time needed to release the mold 9 from the cured imprint material 11 on the previous shot region. For example, the longer the time needed to release the mold 9 from the cured imprint material 11 on the previous shot region is, the larger the amount of the gas 16 leaking from between the mold 9 and the target shot region 29b is. Hence, the shortage amount increases. Hence, the longer the time needed to release the mold 9 from the cured imprint material 11 on the previous shot region is, the more the position at which the target shot region 29b is located in step S1051 is preferably separated from the press position. As described above, the position (second position) different from the press position, at which the target shot region 29b is located in step S1051, is preferably a position decided in accordance with the shortage amount of the gas 16 between the mold 9 and the target shot region 29b from the reference amount.

Figure 8:
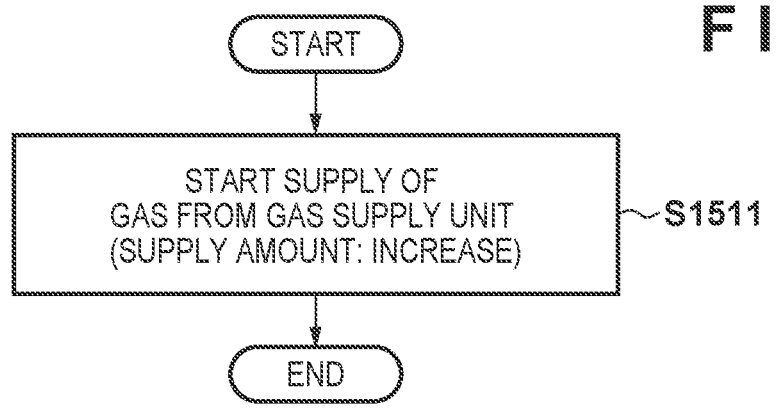
FIG. 8 is a flowchart for describing the second gas supply operation.

In addition, the second gas supply operation is not limited to the gas supply operation described with reference to FIGS. 6A, 6B, and 7, and may be a gas supply operation as shown in FIG. 8. FIG. 8 is a flowchart for describing another example of the second gas supply operation.

Referring to FIG. 8, in step S1511, while maintaining the state in which the target shot region 29b is located at the press position by the first gas supply operation, the control unit 6 starts (resumes) supply of the gas 16 from the gas supply unit 4. At this time, the control unit 6 increases the supply amount of the gas 16 supplied from the gas supply unit 4. More specifically, the supply amount of the gas 16 supplied from the gas supply unit 4 in the second gas supply operation is made larger than the supply amount of the gas 16 supplied from the gas supply unit 4 in the first gas supply operation. Accordingly, the amount of the gas 16 supplied to the space between the pattern region 9a of the mold 9 and the target shot region 29b reaches the reference amount, and the concentration of the gas 16 in the space can be set to a sufficiently high concentration and maintained.

Note that the supply port of the gas supply unit 4 to supply the gas 16 in step S1511 is not limited. For example, the control unit 6 may select an arbitrary supply port from the supply ports 17a to 17d of the gas supply unit 4 and supply the gas 16 from the arbitrary supply port, or may supply the gas 16 from all the supply ports 17a to 17d.

In the second gas supply operation shown in FIG. 8, it is assumed that supply of the gas 16 from the gas supply unit 4 is stopped in the first gas supply operation (step S1056 in FIG. 7). However, supply of the gas 16 from the gas supply unit 4 may not be stopped in the first gas supply operation.

Also, the second gas supply operation shown in FIG. 7 and the second gas supply operation shown in FIG. 8 may be combined. More specifically, when starting (resuming) supply of the gas 16 from the gas supply unit 4 in the second gas supply operation shown in FIG. 7, the supply amount of the gas 16 may be made larger than the supply amount of the gas 16 supplied from the gas supply unit 4 in the first gas supply operation.

In the second gas supply operation described with reference to FIGS. 6A to 8, the target shot region is a shot region where the previous shot region for which the imprint process is performed before the target shot region exists. However, the target shot region may be a first shot region for which the imprint process is performed first on the substrate 12.

Figure 9A:
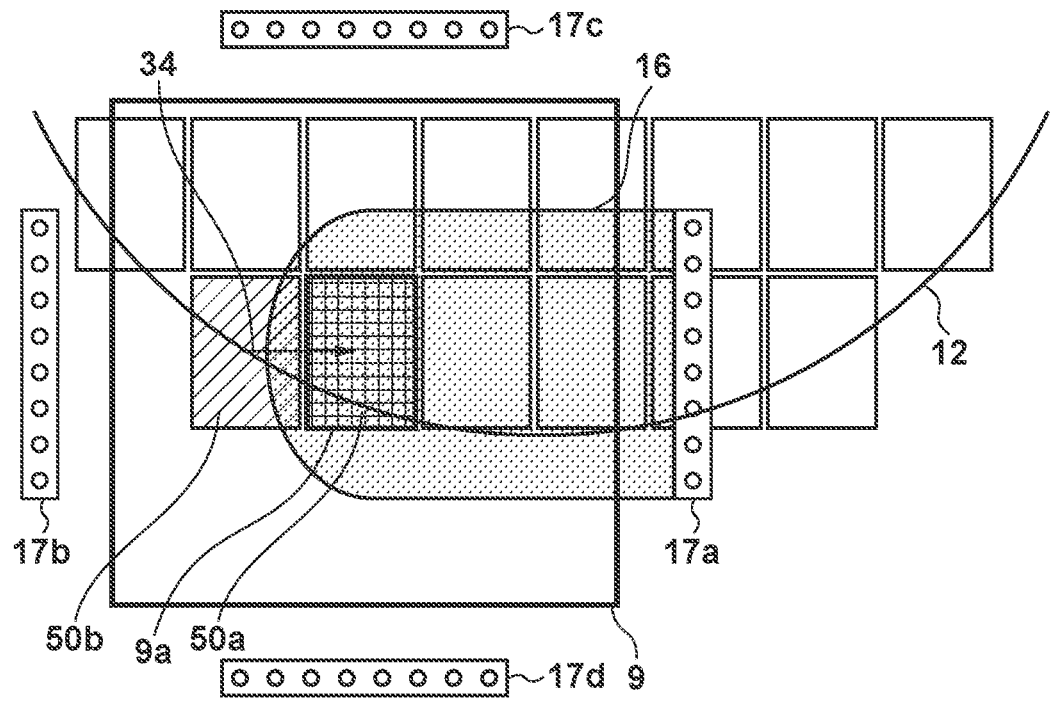
FIGS. 9A and 9B are views for describing the second gas supply operation.
Figure 9B:
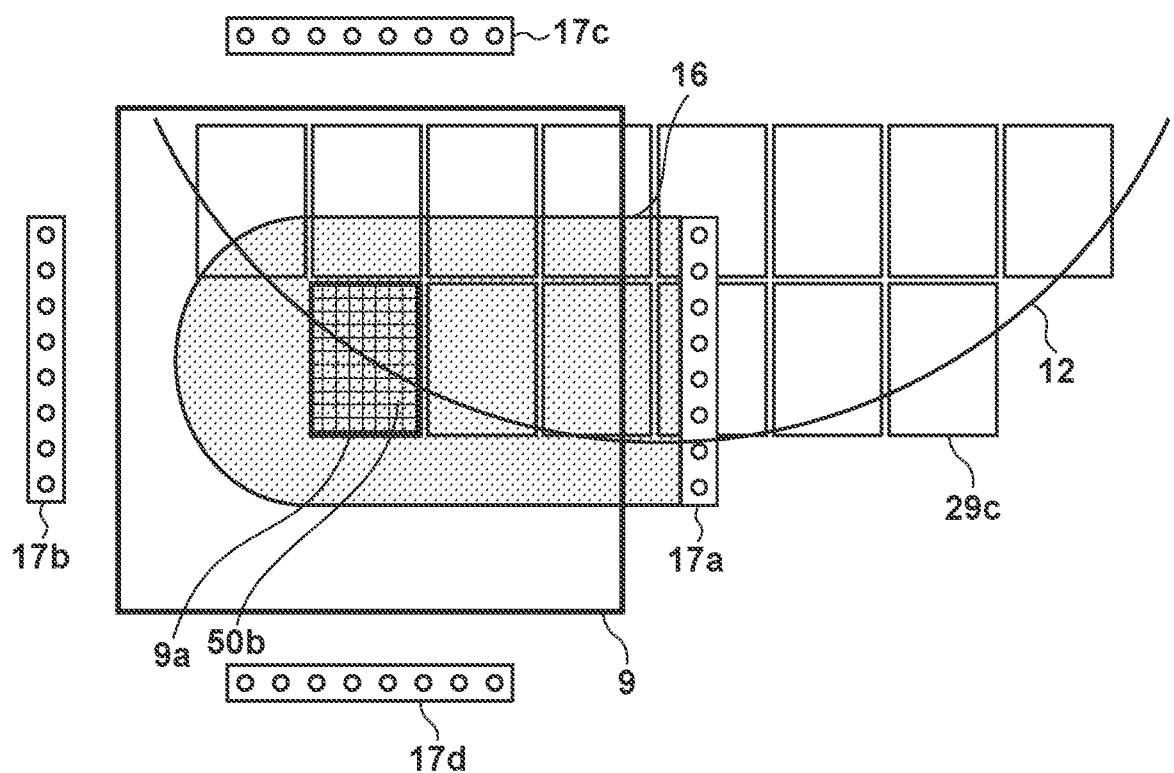

FIGS. 9A, 9B, and 10 are views for describing the second gas supply operation in a case in which a target shot region 50b is the first shot region. FIGS. 9A and 9B are views illustrating the gas supply operation of the gas supply unit 4 and the driving operation of the substrate holding unit 5 in the second gas supply operation. FIGS. 9A and 9B show the gas supply unit 4, the mold 9, and the substrate 12 from above (the side of the mold holding unit 3). FIG. 10 is a flowchart for describing the second gas supply operation.

If the target shot region 50*b* is the first shot region, the imprint process for the previous shot region does not exist. Hence, it is difficult to set the concentration of the gas 16 in the space between the pattern region 9*a* of the mold 9 and the target shot region 50*b* to a sufficiently high concentration and maintain it. Hence, in this embodiment, if the target shot region 50*b* is the first shot region, the second gas supply operation is performed in addition to the first gas supply operation. Note that a shot region for which the imprint process is performed next to the target shot region 50*b* is a next shot region 50*a*.

Referring to FIG. 10, in step S111, the control unit 6 drives the substrate holding unit 5 (substrate 12) such that the target shot region 50*b* is located at a position (second position) different from the press position. In this embodiment, the substrate holding unit 5 is driven such that the next shot region 50*a* is located at the press position under the pattern region 9*a* of the mold 9. Hence, in this embodiment, the position different from the press position is a position where the target shot region 50*b* is located in the state in which the next shot region 50*a* is located at the press position.

In step S112, the control unit 6 drives the mold holding unit 3 (mold 9) in the Z direction (downward) to make the mold 9 and the substrate 12 closer to such an extent that these do not come into contact with each other. For example, the mold holding unit 3 is driven such that the mold 9 is located at a position immediately before it comes into contact with the substrate 12. In other words, in step S112, a pseudo pressing step is performed.

In step S113, the control unit 6 drives the mold holding unit 3 (mold 9) in the Z direction (upward) such that the mold 9 and the substrate 12 which are made closer to such an extent that these do not come into contact with each other are made far from each other. For example, the mold holding unit 3 is driven such that the mold 9 is located at the position before step S112 is performed (such that the mold 9 returns to the original position). In other words, in step S113, a pseudo release step is performed.

When the pseudo pressing step (S112) and the pseudo release step (S113) are performed, for example, the gas 16 supplied by the first gas supply operation and already existing around the mold 9 can be drawn to the lower side of the mold 9.

In step S114, the control unit 6 starts (resumes) supply of the gas 16 from the gas supply unit 4 in a state in which the target shot region 50*b* is located at the position different from the press position. More specifically, the control unit 6 selects at least the supply port 17*a* located in a driving direction 34 of the substrate holding unit 5 from the supply ports 17*a* to 17*d* of the gas supply unit 4, and supplies the gas 16 from the supply port 17*a*, as shown in FIG. 9B.

In step S115, the control unit 6 drives the substrate holding unit 5 (substrate 12) in the driving direction 34 such that the target shot region 50*b* is located at the press position facing the pattern region 9*a* of the mold 9. Accordingly, the gas 16 is drawn to the downstream in the driving direction 34 of the substrate holding unit 5 and supplied to the space between the pattern region 9*a* of the mold 9 and the target shot region 50*b*, as shown in FIG. 9B.

In step S116, when the target shot region 50*b* is located at the press position (when the driving of the substrate holding unit 5 is stopped), the control unit 6 stops supply of the gas 16 from the gas supply unit 4.

As described above, if the target shot region 50*b* is the first shot region, the first gas supply operation and the second gas supply operation are performed. Accordingly, the amount of the gas 16 supplied to the space between the pattern region 9*a* of the mold 9 and the target shot region 50*b* reaches the reference amount, and the concentration of the gas 16 in the space can be set to a sufficiently high concentration and maintained. Hence, the imprint apparatus 1 can implement high productivity while suppressing unfilled defects generated in the pattern of the imprint material 11 formed on the substrate.

Also, the position (second position) different from the press position, at which the target shot region 50*b* is located in step S111, is preferably an arbitrary position according to the shortage amount of the gas 16 between the mold 9 and the target shot region 50*b* from the reference amount. For example, the position different from the press position, at which the target shot region 50*b* is located, may be a position at which the target shot region 50*b* is located in a state in which a shot region next to the next shot region 50*a* is located at the press position.

Note that if the target shot region 50*b* is the first shot region, the previous shot region does not exist, and the time needed to release the mold 9 from the cured imprint material 11 on the previous shot region does not exist, either. Hence, the control unit 6 detects this state as generation of an error that it is estimated that the amount of the gas 16 supplied to the space between the pattern region 9*a* of the mold 9 and the target shot region 50*b* by the first gas supply operation does not reach the reference amount. In addition, if the target shot region 50*b* is the first shot region, the first gas supply operation and the second gas supply operation may be performed regardless of the generation of the error.

Also, in the imprint apparatus 1, when continuously performing the imprint process for a plurality of shot regions on the substrate, in general, whether a foreign substance exists is detected for each shot region. For a shot region with a foreign substance in the plurality of shot regions on the substrate, to prevent break of the mold 9 (pattern region 9*a*), the imprint material 11 on the substrate is not brought into contact with the mold 9, and the imprint process is skipped (the imprint process is not performed). In the shot region (to be referred to as a "skip region" hereinafter) for which the imprint process is skipped, the amount (concentration) of the gas 16 supplied to the space between the pattern region 9*a* of the mold 9 and the skip region by the first gas supply operation tends to be unstable. For this reason, concerning the skip region, the amount of the gas 16 supplied to the space between the pattern region 9*a* of the mold 9 and the skip region by the first gas supply operation may not reach the reference amount. In this case, the shot region for which the imprint process is performed after the skip region is affected. Hence, for the skip region, it is preferably estimated that the amount of the gas 16 supplied to the space between the pattern region 9*a* of the mold 9 and the skip region does not reach the reference amount (that is, an error is generated).

Hence, if a foreign substance exists in the target shot region, the control unit 6 determines the target shot region as a skip region (that is, if the target shot region is the skip region to skip the imprint process), and detects generation of the error. Hence, if the target shot region is the skip region, the first gas supply operation and the second gas supply operation are performed. Accordingly, the amount of the gas 16 supplied to the space between the pattern region 9*a* of the mold 9 and the skip region stably, for example, reaches the reference amount, and the concentration of the gas 16 in the space can be maintained at a predetermined concentration. Note that detection of the foreign substance existing in the shot region on the substrate may be done by providing a foreign substance inspection device in the imprint apparatus 1 or by using an external foreign substance inspection device.

Figure 12A:
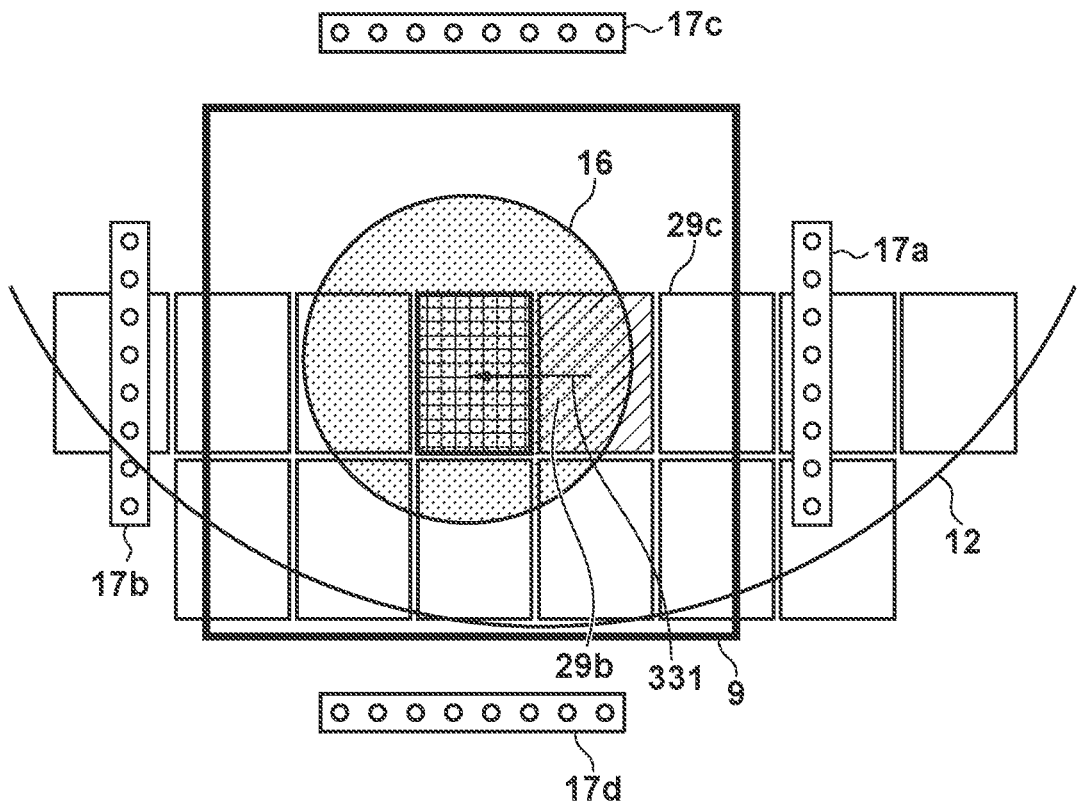
FIGS. 12A and 12B are views for describing the second gas supply operation.
Figure 12B:
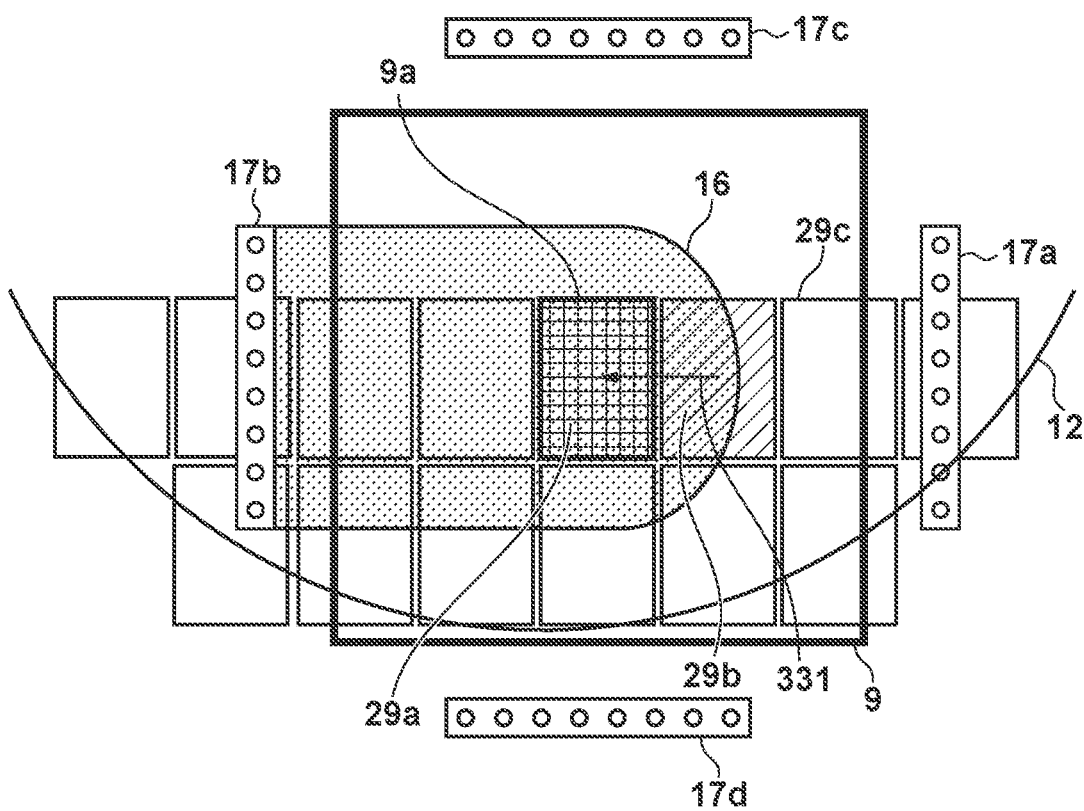

The second gas supply operation in a case in which the target shot region is the skip region will be described with reference to FIGS. 12A, 12B, and 13. FIGS. 12A and 12B are views illustrating the gas supply operation of the gas supply unit 4 and the driving operation of the substrate holding unit 5 in the second gas supply operation. FIGS. 12A and 12B show the gas supply unit 4, the mold 9, and the substrate 12 from above (the side of the mold holding unit 3). FIG. 13 is a flowchart for describing the second gas supply operation.

In step S1201, the control unit 6 drives the substrate holding unit 5 (substrate 12) in a driving direction 331 such that the skip region that is the target shot region 29b is located at the press position (first position) facing the pattern region 9a of the mold 9, as shown in FIG. 12A.

In step S1202, the control unit 6 drives the mold holding unit 3 (mold 9) in the Z direction (downward) to make the mold 9 and the substrate 12 closer to such an extent that these do not come into contact with each other. For example, the mold holding unit 3 is driven such that the mold 9 is located at a position immediately before it comes into contact with the substrate 12. In other words, in step S1202, a pseudo pressing step is performed.

In step S1203, the control unit 6 drives the mold holding unit 3 (mold 9) in the Z direction (upward) such that the mold 9 and the substrate 12 which are made closer to such an extent that these do not come into contact with each other are made far from each other. For example, the mold holding unit 3 is driven such that the mold 9 is located at the position before step S1202 is performed (such that the mold 9 returns to the original position). In other words, in step S1203, a pseudo release step is performed.

In step S1204, the control unit 6 starts (resumes) supply of the gas 16 from the gas supply unit 4 in a state in which the skip region that is the target shot region 29b is located at the press position. More specifically, the control unit 6 selects at least the supply port 17b located in the driving direction 331 of the substrate holding unit 5 from the supply ports 17a to 17d of the gas supply unit 4, and supplies the gas 16 from the supply port 17b, as shown in FIG. 12B.

In step S1205, the control unit 6 drives the substrate holding unit 5 (substrate 12) in the driving direction 331 such that a next target shot region 29c for which the imprint process should be performed next to the skip region (target shot region 29b) is located at the press position facing the pattern region 9a of the mold 9. Accordingly, the gas 16 is drawn to the downstream in the driving direction 331 of the substrate holding unit 5 and supplied to the space between the pattern region 9a of the mold 9 and the next target shot region 29c (FIG. 12B).

As described above, if the target shot region is the skip region, the first gas supply operation and the second gas supply operation are performed. In this case, the amount of the gas 16 supplied to the space between the pattern region 9a of the mold 9 and the skip region stably, for example, reaches the reference amount. This can suppress (prevent) the influence of the skip region on the next target shot region for which the imprint process is performed after the skip region. Hence, the imprint apparatus 1 can implement high productivity while suppressing unfilled defects generated in the pattern of the imprint material 11 formed on the substrate.

Note that in this embodiment, an example in which the skip region to skip the imprint process exists solely has been described. In fact, skip regions may continuously exist. In this case, the second gas supply operation is performed from the position of the shot region where the amount (concentration) of the gas 16 supplied to the space between the pattern region 9a of the mold 9 and the skip region can be maintained constant.

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 11A:
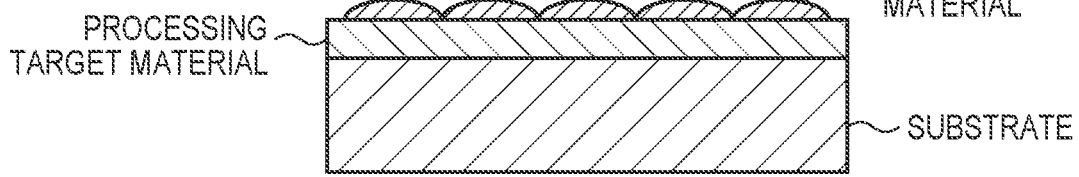
FIGS. 11A to 11F are views for describing an article manufacturing method.

Next, description regarding a detailed method of manufacturing an article is given. As illustrated in FIG. 11A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 11B:
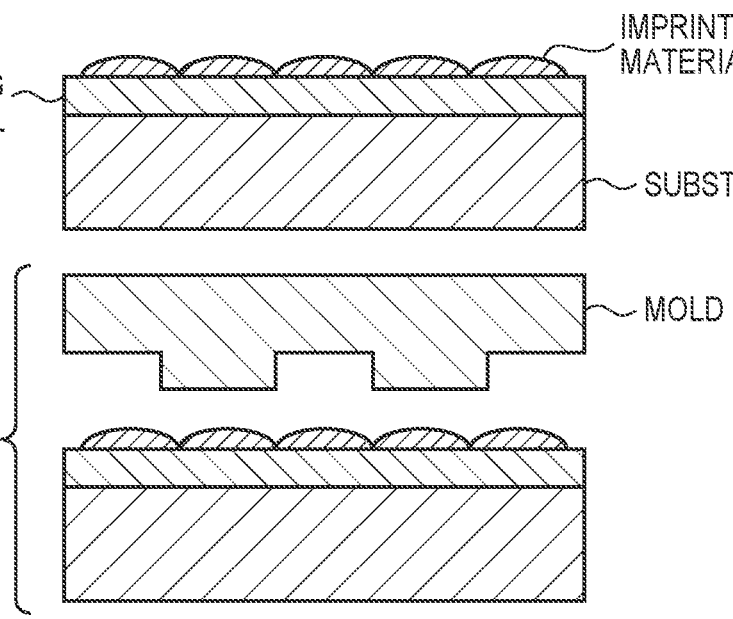
Figure 11C:
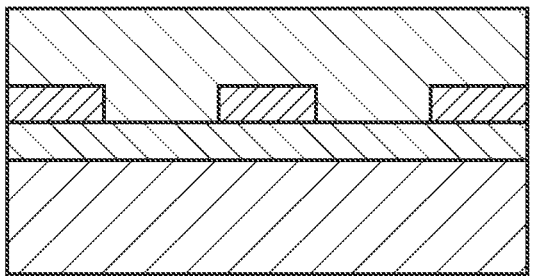

As shown in FIG. 11B, a side of the mold for imprint with a projection and groove pattern is formed on and caused to face the imprint material on the substrate. As illustrated in FIG. 11C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 11D:
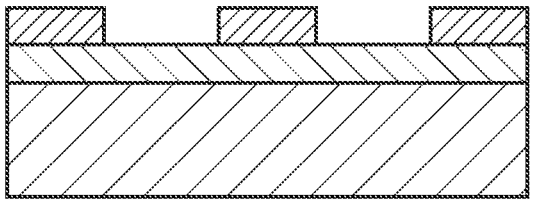

As shown in FIG. 11D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold 4z is transferred to the imprint material.

Figure 11E:
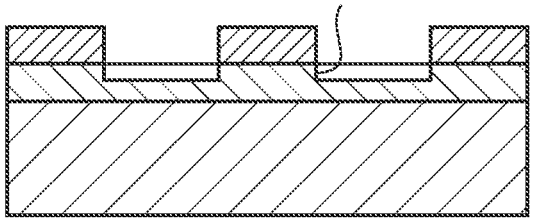
Figure 11F:
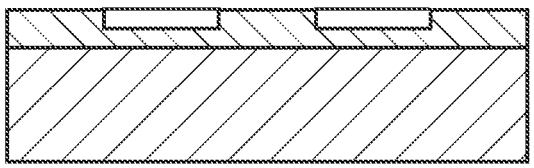

As shown in FIG. 11E, when etching is performed using the pattern of the cured product as an etching resistant mask, a portion of the surface of the processed material where the cured product does not exist or remains thin is removed to form a groove. As shown in FIG. 11F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-068529 filed on Apr. 14, 2021, and Japanese Patent Application No. 2021-196467 filed on Dec. 2, 2021, which are hereby incorporated by reference herein in their entirety.

What is claimed is:

1. An imprint apparatus for performing an imprint process of forming a pattern of an imprint material in a plurality of shot regions on a substrate using a mold, comprising:
a supply unit configured to supply a gas between the mold and the substrate; and
a control unit configured to control an operation of continuously performing the imprint process for the plurality of shot regions on the substrate to which an uncured imprint material is supplied while driving the substrate with respect to the mold,
wherein the control unit
controls performing a first operation of, while driving the substrate such that a target shot region in the plurality of shot regions, for which the imprint process should be performed, is located at a first position facing the mold, supplying the gas from the supply unit,
determines whether to perform a second operation including an operation of additionally supplying the gas after the first operation based on at least one of information regarding a delay or a stop in continuous imprint process for the plurality of shot regions, information regarding a timing of starting supply of the gas in the first operation, information regarding a time needed to release the mold from the cured imprint material on a previous shot region where a previous imprint process is performed before the imprint process for the target shot region, and information regarding skipping the imprint process for the target shot region, and
controls performing the second operation when it is determined to perform the second operation, and
wherein
in the first operation, supply of the gas from the supply unit is started before the target shot region is located at the first position, and supply of the gas from the supply unit is stopped after the target shot region is located at the first position and before the mold and the imprint material on the target shot region are brought into contact with each other, and
in the second operation, the substrate is driven such that the target shot region is located at a second position different from the first position, and supply of the gas from the supply unit is resumed while driving the substrate such that the target shot region located at the second position is located at the first position.

2. The apparatus according to claim 1, wherein in the second operation, after the substrate is driven such that the target shot region is located at the second position before the substrate is driven such that the target shot region is located at the first position, the mold and the substrate are made closer to such an extent that the mold and the substrate do not come into contact with each other, and then, the mold and the substrate that are made closer to the extent are made far from each other.

3. The apparatus according to claim 1, wherein the second position is a position at which the target shot region is located in a state in which the previous shot region for which the previous imprint process is performed before the target shot region is located at the first position.

4. The apparatus according to claim 1, wherein the second position is a position decided in accordance with a shortage amount of the gas between the mold and the target shot region from a reference amount.

5. The apparatus according to claim 1, wherein the target shot region is a shot region for which the imprint process is performed first on the substrate.

6. The apparatus according to claim 5, wherein the second position is a position at which the target shot region is located in a state in which a next shot region for which a next imprint process is to be performed after the target shot region is located at the first position.

7. An imprint apparatus for performing an imprint process of forming a pattern of an imprint material in a plurality of shot regions on a substrate using a mold, comprising:
a supply unit configured to supply a gas between the mold and the substrate; and
a control unit configured to control an operation of continuously performing the imprint process for the plurality of shot regions on the substrate to which an uncured imprint material is supplied while driving the substrate with respect to the mold,
wherein the control unit
controls performing a first operation of, while driving the substrate such that a target shot region in the plurality of shot regions, for which the imprint process should be performed, is located at a first position facing the mold, supplying the gas from the supply unit,
determines whether to perform a second operation including an operation of additionally supplying the gas after the first operation based on at least one of information regarding a delay or a stop in continuous imprint process for the plurality of shot regions, information regarding a timing of starting supply of the gas in the first operation, information regarding a time needed to release the mold from the cured imprint material on a previous shot region where a previous imprint process is performed before the imprint process for the target shot region, and information regarding skipping the imprint process for the target shot region, and
controls performing the second operation when it is determined to perform the second operation, and
wherein
in the second operation, the gas is supplied from the supply unit while maintaining a state in which the target shot region is located at the first position by the first operation, and
a supply amount of the gas supplied from the supply unit in the second operation is larger than the supply amount of the gas supplied from the supply unit in the first operation.

8. The apparatus according to claim 7, wherein in the first operation, supply of the gas from the supply unit is started before the target shot region is located at the first position, and supply of the gas from the supply unit is stopped after the target shot region is located at the first position before the mold and the imprint material on the target shot region are brought into contact with each other.

9. The apparatus according to claim 1, wherein when the timing of starting supply of the gas from the supply unit in the first operation is delayed from a reference, or when the time needed to release the mold from the cured imprint material on the previous shot region in the previous imprint process performed for the previous shot region before the target shot region is longer than a reference, the control unit determines to perform the second operation.

10. The apparatus according to claim 1, wherein the control unit determines to skip the imprint process for a shot region where a foreign substance exists.

11. An imprint method for performing an imprint process of forming a pattern of an imprint material in a shot region on a substrate using a mold, comprising:

controlling an operation of continuously performing the imprint process for a plurality of shot regions on the substrate to which an uncured imprint material is supplied while driving the substrate with respect to the mold, wherein the controlling includes, controlling performing of a first operation of, while driving the substrate such that a target shot region in the plurality of shot regions, for which the imprint process should be performed, is located at a first position facing the mold, supplying the gas from the supply unit, determining whether to perform a second operation including an operation of additionally supplying the gas after the first operation based on at least one of information regarding a delay or a stop in continuous imprint process for the plurality of shot regions, information regarding a timing of starting supply of the gas in the first operation, information regarding a time needed to release the mold from the cured imprint material on a previous shot region where a previous imprint process is performed before the imprint process for the target shot region, and information regarding skipping the imprint process for the target shot region, and controlling performing the second operation when it is determined to perform the second operation, and wherein in the first operation, supply of the gas from the supply unit is started before the target shot region is located at the first position, and supply of the gas from the supply unit is stopped after the target shot region is located at the first position and before the mold and the imprint material on the target shot region are brought into contact with each other, and in the second operation, the substrate is driven such that the target shot region is located at a second position different from the first position, and supply of the gas from the supply unit is resumed while driving the substrate such that the target shot region located at the second position is located at the first position.

12. An article manufacturing method comprising:

forming a pattern on a substrate using an imprint apparatus defined in claim 1;

processing the substrate on which the pattern is formed in the forming; and manufacturing an article from the processed substrate.

13. The apparatus according to claim 1, wherein the information regarding the delay or the stop in continuous imprint process for the plurality of shot regions includes information on whether or not a periodical continuous driving has been performed in continuous imprint process for the plurality of shot regions.

* * * * *